Figure 1:
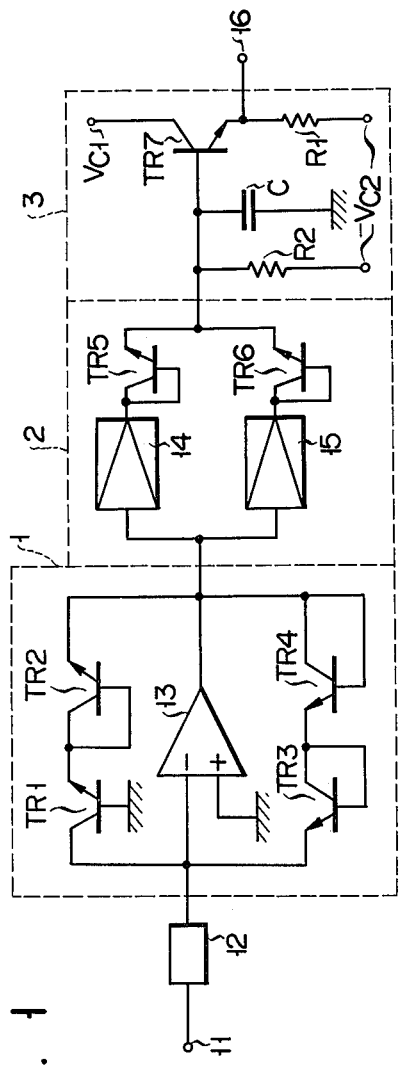

United States Patent [19]

Katakura et al.

[11] 4,109,165

[45] Aug. 22, 1978

[54] RMS CIRCUIT

[75] Inventors: Masayuki Katakura, Yokohama; Hisashi Yamada, Kawasaki, both of Japan

[73] Assignee: Tokyo Shibaura Electric Co., Ltd., Kawasaki, Japan

[21] Appl. No.: 768,367

[22] Filed: Feb. 14, 1977

[51] Int. Cl.² ............................................. H03K 17/00
[52] U.S. Cl. .................................. 307/229; 307/230; 328/145; 324/132; 328/26
[58] Field of Search .................. 328/144, 145, 26; 307/229, 230; 324/132

[56] References Cited

U.S. PATENT DOCUMENTS

| | | | |
|---|---|---|---|
| 3,430,072 | 2/1969 | Stevens | 307/250 |
| 3,681,618 | 8/1972 | Blackmer | 328/145 |
| 3,967,105 | 6/1976 | Harrington | 328/145 |

*Primary Examiner*—Stanley D. Miller, Jr.
*Assistant Examiner*—B. P. Davis

*Attorney, Agent, or Firm*—Oblon, Fisher, Spivak, McClelland & Maier

[57] ABSTRACT

An RMS circuit comprising a logarithmic amplifying circuit, a fullwave rectifying circuit for subjecting an output from the logarithmic amplifying circuit to fullwave rectification, and a smoothing circuit for smoothing an output signal from the fullwave rectifying circuit, wherein the logarithmic amplifying circuit is provided with an operational amplifier whose noninverting input terminal is grounded and whose inverting input terminal is connected to a signal source; a first npn transistor whose collector is connected to the inverting input terminal of the operational amplifier and whose base is grounded; a first diode whose anode is connected to the emitter of the first npn transistor and whose cathode is connected to the output terminal of the operational amplifier; a second diode whose anode is connected to the output terminal of the operational amplifier; and a third diode whose anode is connected to the cathode of the second diode and whose cathode is connected to the noninverting input terminal of the operational amplifier.

4 Claims, 3 Drawing Figures

RMS CIRCUIT

The prior art audio apparatus is provided with a noise reduction circuit to decrease noises of audio signals. The noise reduction circuit comprises an RMS circuit for producing a control signal proportional to the logarithm of the root mean square (r.m.s.) value of an input signal and a voltage-controlled amplifier whose gain is controlled by an output control signal from the RMS circuit. The RMS circuit comprises, as set forth in the U.S. Pat. No. 3,681,618, a logarithmic amplifying circuit for generating a logarithmic output symmetrical with positive and negative input signals; a fullwave rectifying circuit provided with amplifiers for two fold multiplying output signals from the logarithmic amplifying circuit positively and negatively and diodes connected to the amplifiers; and a smoothing circuit for smoothing and an output signal from the fullwave rectifying circuit.

The logarithmic amplifying circuit is formed of an operational amplifier and *pnp* and *npn* transistors. However, the prior art audio apparatus has the drawbacks that the transistors and the diodes of the fullwave rectifying circuit are subject to functional variations unavoidably occurring during manufacture and that, to maintain a represcribed relationship between the operation characteristics of these elements, it is necessary to select proper ones from among these elements or provide a complicated circuit for adjusting the operating conditions of the elements adapted. Moreover, the transistors and diodes have the operation characteristic prominently affected by ambient temperature. To eliminate temperature difference between important elements, therefore, they have to be so coupled as to have the same level of temperature with the resultant complication in manufacture.

It can be contemplated to integrate an RMS circuit in order to eliminate the functional variations of the transistors and diodes. A *pnp* transistor is generally formed as a lateral transistor by monolithic integration. The lateral *pnp* transistor has a small current-amplification factor and low transition frequency and moreover a large resistance. Where used with the logarithmic amplifying circuit, therefore, the lateral *pnp* transistor degrades the property of the logarithmic aplifying circuit.

It is accordingly the object of this invention to provide an RMS circuit suitable for integration.

According to an aspect of this invention, there is provided an RMS circuit which comprises a logarithmic amplifying circuit including operational amplifier provided with a signal input terminal, a first feedback circuit connected between the input and output terminals of the operational amplifier for the feedback of either of the positive and negative components of an input signal and provided with a first *npn* transistor and first unidirectional circuit element, the emitter and collector of said *npn* transistor being connected in series with the first unidirectional circuit element, and a second feedback circuit connected in series between the input and output terminals of the operational amplifier for the feedback of the other of the positive and negative components of the input signal, and formed of second and third unidirectional circuit elements connected in series; a fullwave rectifying circuit for subjecting an output signal from the logarithmic amplifying circuit to fullwave rectification; and a smoothing circuit for smoothing an output signal from the fullwave rectifying circuit.

Figure 3:
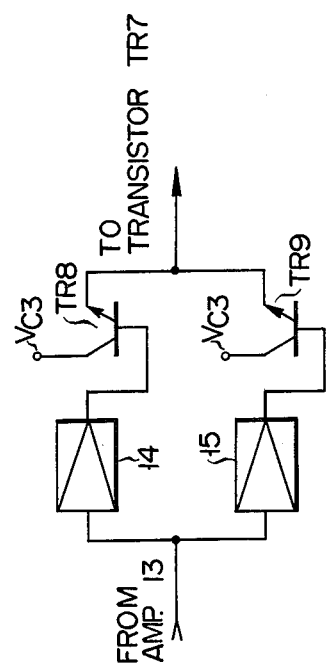
Figure 2:
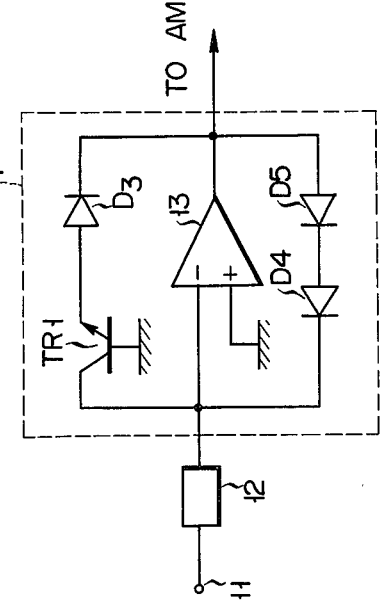

This invention can be more fully understood from the following detailed description when taken in conjunction with the accompanying drawing, in which:

FIG. 1 shows the arrangement of an RMS circuit according to an embodiment of this invention;

FIG. 2 presents a modification of the logarithmic amplifying circuit used with the RMS circuit of FIG. 1; and FIG. 3 indicates a modification of the rectifier used with the RMS circuit of FIG. 1.

The RMS circuit of FIG. 1 comprises a logarithmic amplifying circuit 1; a fullwave rectifying circuit 2 for subjecting an output signal from the logarithmic amplifying circuit 1 to fullwave rectification; and a smoothing circuit for producing a signal proportional to the logarithm of the r.m.s. value of an input signal supplied to the fullwave rectifying circuit 2.

An input signal supplied to the input terminal 11 is conducted as input current i through an impedance element 12 to the inverting input terminal of an operational amplifier 13 included in the logarithmic amplifying circuit 1. The noninverting input terminal of the operational amplifier 13 is grounded. Connected between the inverting input terminal and the output terminal of the operational amplifier 13 are a series circuit formed of an *npn* transistor TR1 and diode-connected *npn* transistor TR2 to constitute a feedback circuit for a positive signal component and a series circuit formed of diode-connected *npn* transistors TR3 and TR4 to constitute a feedback circuit for a negative signal component. The collector of the *npn* transistor TR1 is connected to the inverting input terminal of the operational amplifier 13, the base thereof is grounded and the emitter thereof is connected to the collector of the *npn* basis for TR2. The base and collector of the *npn* transistor TR2 are connected together, and the emitter thereof is connected to the output terminal of the operational amplifier. The base and collector of the *npn* transistor TR4 are jointly connected to the output terminal of the operational amplifier 13. The base and collector of the *npn* transistor TR3 are jointly connected to the emitter of the *npn* transistor TR4. The emitter of the *npn* transistor TR3 is connected to the inverting input terminal of the operational amplifier 7.

Where supplied to the input terminal 11, a positive input signal is processed by the operational amplifier 13 and *npn* transistors TR1 and TR2. The operational amplifier 13 sends forth an output voltage signal corresponding to twice the logarithmic value of an input signal. Where supplied to the input terminal 11, negative input signal is processed by the operational amplifier 13 and *npn* transistors TR3 and TR4. The operational amplifier generates an output voltage signal corresponding to twice the logarithmic value of the negative input signal. An output from the operational amplifier 13 is divided into two components, one of which is supplied to an in-phase amplifier 14 and the other of which is conducted to an inverting amplifier 15. Outputs from these amplifiers 14 and 15 are added together after being rectified by diode-connected *npn* transistors TR5 and TR6 respectively. As the result, the fullwave rectifying circuit 2 sends forth an output voltage signal corresponding to the logarithm of a square of an input signal.

An output signal from the fullwave rectifier 2 is delivered to the smoothing circuit 3 comprising an *npn* transistor TR7 whose base is connected to the emitters of the transistors TR5 and TR6, whose collector is connected to a positive power source Vc1 and whose emitter is connected to a negative power source Vc2 through a resistor R1, a capacitor C, one end of which is connected to the base of the transistor TR7 and the other end of which is grounded, and a resistor R2, one end of which is connected to the base of the transistor TR7 and the other end of which is connected to a negative power source Vc2. An input signal to the smoothing circuit 3 is smoothed by the capacitor C and then supplied to the base of the transistor TR7. Accordingly, the output terminal 16 of the subject RMS circuit connected to the emitter of the transistor TR7 generates an output signal corresponding to the logarithm of the r.m.s. value of an input signal supplied to the input terminal 11 of the RMS circuit.

As mentioned above, the RMS circuit of this invention, whose logarithmic amplifying circuit 1 is not provided with a pnp transistor displays a more improved operation characteristic when integrated. Compared with the prior art fullwave rectifying circuit including amplifiers having an amplification factor of 2, the fullwave rectifying circuit 2 which includes amplifiers 14 and 15 having an amplification factor of 1 is less subject to the influence due to the variation in the ratio of resistances of the resistors used in the amplifiers to determine the amplification factor thereof.

There has been described an RMS circuit according to an embodiment of this invention. However, the invention is not limited to this embodiment. The object of the invention is still attained by replacing the npn transistors TR2 to TR4 of the logarithmic amplifying circuit 1 of FIG. 1 by ordinary diodes D3 to D5 of FIG. 2. Further, the diode-connected transistors TR5 and TR6 used with the fullwave rectifying circuit 2 of FIG. 1 may be substituted by emitter-follower npn transistors TR8 and TR9 of FIG. 3 whose collectors are connected to a power source Vc3, whose bases are connected to the respective amplifiers 14 and 15 and whose emitters are connected to the base of the transistor TR7. Since, in this case, the level of current supplied to the base of the transistor TR7 is decided by the power source Vc3 and the emitter-follower transistors, the amplifiers 14 and 15 can be designed to have a high output impedance.

What we claim is:

1. An RMS circuit comprising:
   a logarithmic amplifying circuit including an operational amplifier provided with a signal input terminal and an output terminal,
   a first feedback circuit for the feedback of one of the positive and negative components of the input signal formed of first and second npn transistors whose emitter-collector paths are connected in series between the input and output terminals of the operational amplifier,
   the base and collector of the second npn transistor being connected together,
   a second feedback circuit for the feedback of the other of the positive and negative components of the input signal formed of third and fourth npn transistors whose emitter-collector paths are connected in series between the input and output terminals of the operational amplifier,
   the base and collector of each of the third and fourth npn transistors being connected together,
   the first feedback circuit and operational amplifier being combined to form a first logarithmic amplifying section,
   the second feedback circuit and operational amplifier being combined to form a second logarithmic amplifying section,
   a fullwave rectifying circuit coupled to said output terminal for subjecting an output signal from the logarithmic amplifying circuit to fullwave rectification,
   the fullwave rectifying circuit being connected to receive a signal from the logarithmic amplifying circuit corresponding to twice the logarithmic value of an input signal supplied to the logarithmic amplifying circuit and to produce a signal corresponding to the logarithmic value of a square of an input signal supplied to the logarithmic amplifying circuit, and
   a smoothing circuit coupled to said rectifying circuit for smoothing an output signal from the fullwave rectifying circuit.

2. An RMS circuit according to claim 1, wherein the fullwave rectifying circuit comprises an in-phase amplifier having an amplification factor of 1 and connected to the output terminal of the operational amplifier; a pn junction device connected to the output terminal of the in-phase amplifier; an inverting amplifier having an amplification factor of 1 and connected to the output terminal of the operational amplifier; and a pn junction device connected to the output terminal of the inverting amplifier.

3. An RMS circuit according to claim 1, wherein the fullwave rectifying circuit comprises an in-phase amplifier having an amplification factor of 1 and connected to the output terminal of the operational amplifier; an npn transistor whose collector and base are jointly connected to the output terminal of the in-phase amplifier and whose emitter is connected to the smoothing circuit; an inverting amplifier having an amplification factor of 1 and connected to the output terminal of the operational amplifier; and an npn transistor whose collector and base are jointly connected to the output terminal of the inverting amplifier and whose emitter is connected to the smoothing circuit.

4. An RMS circuit according to claim 1, wherein the fullwave rectifying circuit comprises an in-phase amplifier having an amplification factor of 1 and connected to the output terminal of the operational amplifier; a second npn transistor whose base is connected to the output terminal of the in-phase amplifier, whose emitter is connected to the smoothing circuit and whose collector is connected to a power source terminal, an inverting amplifier having an amplification factor of 1 and connected to the output terminal of the operational amplifier; and a third npn transistor whose base is connected to the output terminal of the operational amplifier, whose emitter is connected to the emitter of the second npn transistor and whose collector is connected to the power source terminal.

* * * * *